(12) United States Patent
Wang et al.

(10) Patent No.: US 10,998,883 B2
(45) Date of Patent: May 4, 2021

(54) TYPE OF ULTRA-WIDE BAND SAW FILTER

(71) Applicant: Shoulder Electronics Co., Ltd., Wuxi (CN)

(72) Inventors: Weibiao Wang, Wuxi (CN); Hongqing Mao, Wuxi (CN); Peng Wei, Wuxi (CN); Zengtian Lu, Wuxi (CN); Zhuang Li, Wuxi (CN); Zhaosu Sun, Wuxi (CN)

(73) Assignee: Shoulder Electronics Co., Ltd., Wuxi (CN)

( * ) Notice: Subject to any disclaimer, the term of this patent is extended or adjusted under 35 U.S.C. 154(b) by 0 days.

(21) Appl. No.: 15/574,486

(22) PCT Filed: Apr. 6, 2017

(86) PCT No.: PCT/CN2017/079523
§ 371 (c)(1),
(2) Date: Nov. 16, 2017

(87) PCT Pub. No.: WO2018/113138
PCT Pub. Date: Jun. 28, 2018

(65) Prior Publication Data
US 2019/0312569 A1    Oct. 10, 2019

(30) Foreign Application Priority Data
Dec. 23, 2016  (CN) .......................... 201611203355.6

(51) Int. Cl.
*H03H 9/64* (2006.01)
*H03H 9/25* (2006.01)
(Continued)

(52) U.S. Cl.
CPC ...... *H03H 9/6483* (2013.01); *H03H 9/14514* (2013.01); *H03H 9/24* (2013.01); *H03H 9/25* (2013.01); *H03H 9/6413* (2013.01)

(58) Field of Classification Search
CPC .... H03H 9/6483; H03H 9/25; H03H 9/14514; H03H 9/24
(Continued)

(56) References Cited

U.S. PATENT DOCUMENTS 8,902,020 B2* 12/2014 Bradley ................. H03H 9/725
                                                                            333/133
2013/0300519 A1* 11/2013 Tamasaki ........... H03H 9/02834
                                                                            333/133

OTHER PUBLICATIONS

Kadota et al., "Ultra Wide Band Resonator composed of Grooved Cu-Electrode on LiNbO3 and its Application to Tunable Filter", Sep. 2009, 2009 IEEE International Ultrasonics Symposium, pp. 2668-2671 (Year: 2009).*

* cited by examiner

*Primary Examiner* — Robert J Pascal
*Assistant Examiner* — Jorge L Salazar, Jr.
(74) *Attorney, Agent, or Firm* — George C. Wang; Bei & Ocean

(57) ABSTRACT

The present invention discloses a type of ultra-wide band SAW filter which comprises a first SAW resonator group and a second SAW resonator group that are connected to form a ladder structure. Each SAW resonator in the said first SAW resonator group has the same film thickness; each SAW resonator in the said second SAW resonator group has the same film thickness; the film thickness of each SAW resonator in the said first SAW resonator group is the same as or different from the film thickness of each SAW resonator in the said second SAW resonator group. The SAW filter according to the present invention can realize the pass-band non-parasitic mode response and is a high-performance ultra-wide band filter with a bandwidth of 6-20% of the center frequency and an insertion loss of less than 2 dB, and the present invention features small size, low cost and a
(Continued)

broad application prospect in the field of military and civilian communications equipment.

3 Claims, 3 Drawing Sheets

(51) Int. Cl.
    *H03H 9/145*     (2006.01)
    *H03H 9/24*     (2006.01)

(58) Field of Classification Search
    USPC .......................................... 333/133, 193–196
    See application file for complete search history.

TYPE OF ULTRA-WIDE BAND SAW FILTER

TECHNICAL FIELD

The present invention relates to a filter, and more particularly to an ultra-wide band SAW filter.

BACKGROUND

The surface acoustic wave (SAW) is an elastic wave which propagates along the surface of an object. The SAW device features low cost, small size and many functions and is widely applied in such fields as radar, communication, navigation and identification. With the rapid development of the mobile communication technology, China's SAW devices are also moving into the field of mobile communication and, with the diversified development of communication modes, there will be a huge application requirement for the ultra-wide band and low-loss filters in the future communication system. In civil and military electronic systems, the ultra-wide band filters are mostly LC filters that have large size and bad selectivity, thus limiting the miniaturization and performance of the complete equipment.

TECHNICAL PROBLEM

Owing to the constraints from the material electromechanical coupling coefficient and design scheme, the existing SAW filters generally have a bandwidth that is generally less than 5% of the center frequency and a pass-band insertion loss of 1 db or more. The conventional materials for the SAW are quartz, lithium tantalite and piezoelectric film materials which have a low electromechanical coupling coefficient; the conventional single film thickness structure cannot achieve the design of a wide band filter, if a wide band filter is designed as such structure constrainedly, the device performance indicators cannot meet the requirements of communication application. A ladder filter is formed through the cascade connection of series resonators and parallel resonators and both the series resonators and the parallel resonators used in the existing design adopt the same metal film thickness.

The Ultra-Wide Band and Low-Loss SAW Ladder Filter on a Cu-grating/15° YX-LiNbO3 Structure, 2006 IEEE Ultrasonics Symposium, 1874-1877 released by T. Omori, †K. Matsuda, Y. Sugama, Y. Tanaka, K. Hashimoto and M. Yamaguchi reported the ultra-wide band filter that takes the copper as electrode material on the lithium niobate substrate. However, the pass-band of such filters has a Rayleigh wave parasitic response which is generally 5-6 dB in size. In the Document No. 1, the energy of the Rayleigh wave is absorbed through applying a layer of organic adhesive onto the surface of a resonator so that the Rayleigh wave response is reduced to 2-3 dB. However, such parasitic response is unacceptable in the actual applications.

In view of the deficiencies of the prior arts, the present invention discloses a type of ultra-wide band SAW filter.

SOLUTION TO THE PROBLEM

Technical Solution

The technical solution provided by the present invention is:

A type of ultra-wide band SAW filter comprising a first SAW resonator group and a second SAW resonator group that are connected to form a ladder structure, wherein, each SAW resonator in the said first SAW resonator group has the same film thickness; each SAW resonator in the said second SAW resonator group has the same film thickness; the film thickness of each SAW resonator in the said first SAW resonator group is the same as or different from the film thickness of each SAW resonator in the said second SAW resonator group.

A further technical solution is that the said SAW resonators are made on the dielectric substrates which are made of a Y-rotated 0-64° lithium niobate material.

A further technical solution is that the filter further comprises the electrodes connected to the SAW resonator groups; the said electrodes are made of copper, tungsten, gold or platinum material.

BENEFICIAL EFFECT OF THE INVENTION

Beneficial Effect

The beneficial technical effects of the present invention are as follows:

The SAW filter according to the present invention can achieve the pass-band non-parasitic mode response and is a high-performance ultra-wide band filter with a bandwidth of 6-20% of a center frequency and an insertion loss of less than 2 dB, and the present invention features small size, low cost and a broad application prospect in the field of military and civilian communication equipment. FIG. 3 is a simulation result diagram of one embodiment of the present invention, showing the simulation design parameters of an ultra-wide band filter with a center frequency of 1698 MHz and a bandwidth of 300 MHz that is designed based on the scheme according to the present invention. The 1 db bandwidth can reach 363 MHz with an insertion loss of only 0.214 db.

Compared with the prior arts, the present invention falls into the field of acoustics and adopts the SAW resonators. The principle and properties of the SAW resonators are completely different from those of the dielectric resonators in the prior arts and the technical effects that can be achieved by the SAW resonator are also different. The present invention can greatly widen the bandwidth of the SAW filter.

The design proposed by the present invention utilizes the difference in the propagation properties of the Rayleigh wave, longitudinal wave and body wave in the Y-rotated 0-64° lithium niobate material and adopts the design with a ladder structure, copper electrodes and different film thicknesses to achieve a bandwidth of more than 20% and ensure a low pass-band insertion loss thus to avoid the corresponding parasitic effects.

BRIEF DESCRIPTION OF DRAWINGS

Description of Drawings

Figure 1:
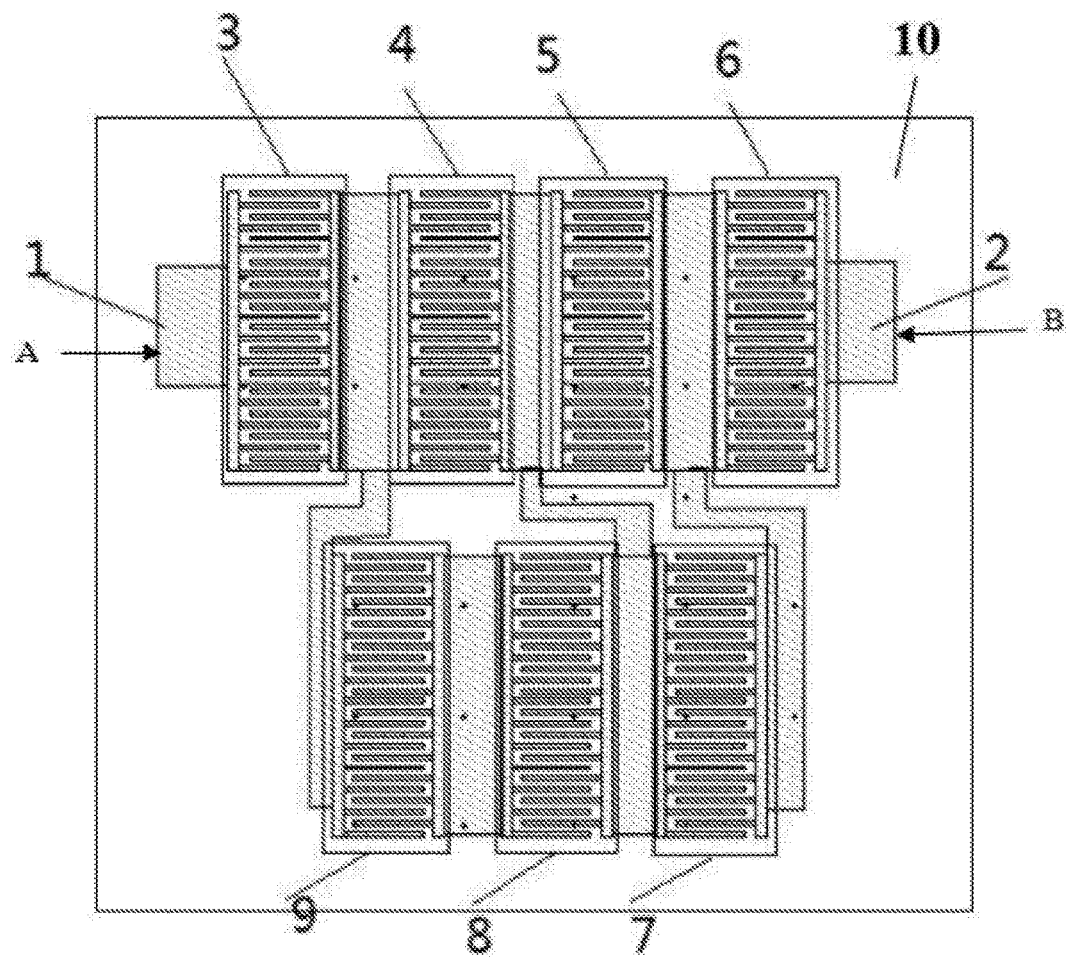

FIG. 1 is a structural diagram of the present invention.

Figure 2:
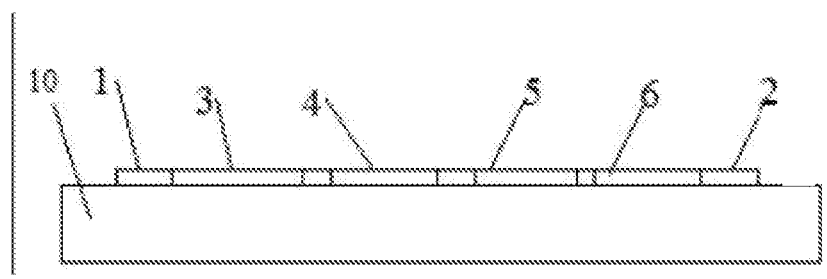

FIG. 2 is a cross-sectional view of the structure of the present invention.

Figure 3:
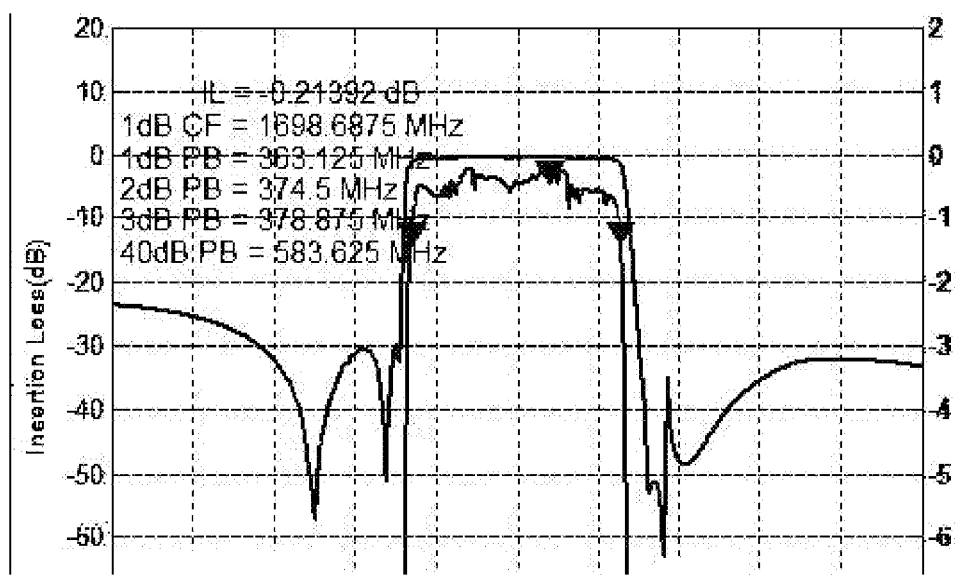

FIG. 3 is a simulation result diagram of one embodiment of the present invention.

INVENTION EMBODIMENTS

Embodiments of the Present Invention

FIG. 1 is a structural diagram of the present invention.

FIG. 2 is a cross-sectional view of the structure of the present invention. As shown in FIGS. 1 and 2, the present invention comprises dielectric substrates 10 on which the series SAW resonator groups 3, 4, 5 & 6 and the parallel SAW resonator groups 7, 8 & 9 are mounted. The series SAW resonator groups 3, 4, 5 & 6 and the parallel SAW resonator groups 7, 8 & 9 are connected to form a ladder structure. The ladder structure that is formed by four series SAW resonators and three parallel SAW resonators as shown in FIG. 1 is used in the present embodiment. The number of series SAW resonators and parallel SAW resonators may be increased or decreased depending on the different design requirements such as different center frequencies and bandwidths. The ladder structure has excellent stop-band suppression performance and can guarantee the performance of the filter in the stop-band.

The series SAW resonator groups 3, 4, 5 & 6 are H1 in thickness while the parallel SAW resonator groups 7, 8 & 9 are H2 in thickness. In the present invention, the SAW filter utilizes two groups of SAW resonator arrays with different thicknesses to optimize the series and parallel SAW resonators respectively so as to eliminate the parasitic mode and utilizes the gap between the film thicknesses to further widen the bandwidth of the filter. As shown in FIG. 2, H1=H2 in the present embodiment, preferably, H1 H2.

The dielectric substrates 10 are made of the Y-rotated 0-64° lithium niobate material. Such piezoelectric material has a large electromechanical coupling coefficient, which is beneficial to the transmission of the pass-band signal and can guarantee that the filter has a low insertion loss in the wide pass-band range.

A first electrode 1 and a second electrode 2 are connected to both ends of the series SAW resonator groups 3, 4, 5 & 6 respectively and serve as the input and output of the SAW filter. A first electrode 1 and a second electrode 2 are made of such heavy metal materials as copper, tungsten, gold or platinum.

The present invention utilizes the large electromechanical coupling coefficient of the lithium niobate substrate, selects heavy metals such as copper, tungsten, gold or platinum as the electrode material and achieves the fabrication of the filter according to the present invention through designing the combination of two groups of ladder resonators with different thicknesses in conjunction with the micro-processing technology and two processes of graphic processing.

In the present invention, the said design achieves a type of ultra-wide band SAW filter with a very low insertion loss through clever combination of material, structure and process.

Only one preferred embodiment of the present invention is stated above and the present invention is not limited to the above-mentioned embodiment. It can be understood that any other improvements and changes that are directly derived or associated by the technicians in this filed from or with the spirit and idea of the present invention shall be deemed to be included within the protection scope of the present invention.

What is claimed is:

1. A type of ultra-wide band SAW filter, comprising a first SAW resonator group and a second SAW resonator group that are connected to form a ladder structure, wherein each SAW resonator in the first SAW resonator group has a same first film thickness, each SAW resonator in the second SAW resonator group has a same second film thickness and the first film thickness is different from the second film thickness, wherein the first film thickness and the second film thickness are selected to eliminate a parasitic mode in a passband of the SAW filter.

2. The ultra-wide band SAW filter according to claim 1, wherein, the said SAW resonators of the first and second SAW resonator groups are made on the dielectric substrates which are made of a Y-rotated 0-64° lithium niobate material.

3. The ultra-wide band SAW filter according to claim 1, further comprising electrodes connected to the first and second SAW resonator groups; the electrodes being made of copper, tungsten, gold or platinum material.

* * * * *